Dec. 18, 1956 N. C. FULMER 2,774,880

TELEVISION TUNING SYSTEM

Filed Dec. 6, 1952

INVENTOR.
NORMAN C. FULMER

BY Darby & Darby

ATTORNEYS

United States Patent Office 2,774,880 Patented Dec. 18, 1956

2,774,880

TELEVISION TUNING SYSTEM

Norman C. Fulmer, Montclair, N. J., assignor to Allen B. Du Mont Laboratories, Inc., Clifton, N. J., a corporation of Delaware Application December 6, 1952, Serial No. 324,580

6 Claims. (Cl. 250—40)

This invention relates to tuning systems such as are used in television and radio receivers, and relates more particularly to turret-type tuners.

In the prior art tuners, it has been customary to employ a rotatable turret containing tuned circuits and contact means for selectively connecting the tuned circuits to the receiver circuits when the turret is rotated. This provides "coarse" tuning for selection of, for example, various television frequency channels. Because this type of coarse tuning device is difficult to manufacture accurately, and because of a tendency to drift out-of-tune, it has been customary to provide a "fine" tuning knob, for the purpose of obtaining precise adjustment of tuning. The "fine" tuning knob actuates a trimmer condenser or inductance for affecting the tuning over a limited range.

It will be appreciated, then, that turret-type tuners of the prior art require not only an additional component part in the form of a trimmer condenser or inductance, but also require an additional knob and shaft, either concentric with the coarse-tuning knob and shaft, or separate therefrom. Furthermore, the prior art fine-tuning systems suffer the disadvantage of varying only the capacitance or inductance of the circuit, thereby undesirably varying the L–C ratio or "Q" of the tuned circuit.

An object of the present invention is to provide a turret-type tuner having a single tuning shaft.

Another object is to provide a tuner in which both coarse and fine tuning are accomplished by means of a single shaft and knob.

A further object is to provide a tuning system having a fine-tuning adjustment which varies both the inductance and capacitance of a tuned circuit.

Still other objects will be apparent.

Referring to the drawings.

Figure 1:
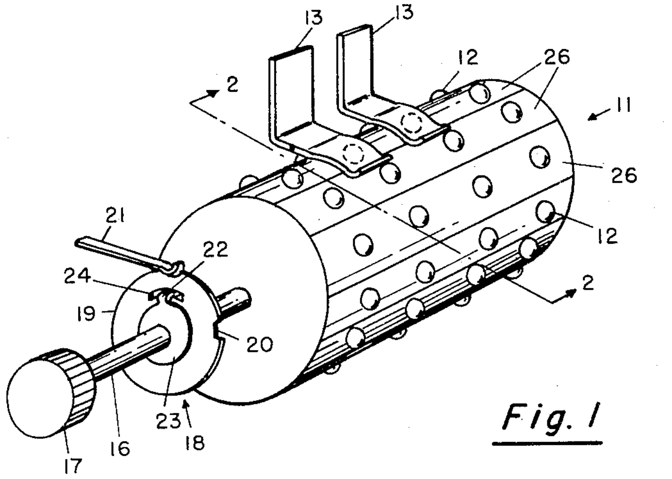
Figure 1 shows a perspective view of a preferred embodiment of the invention.

The novel tuning system comprises essentially a rotatable tuning turret 11 containing various tuned circuits which are connected to contact pins 12 on the surface of the turret. Contact arms 13 make selective engagement with various contact pins 12 and also provide fine tuning, as will be described hereafter. The turret 11 is rotated by means of a shaft 16 and a tuning knob 17 which preferably are mounted axially with respect to the turret 11.

A lost-motion detent device 18 is provided as a part of the shaft mechanism. As shown in its preferred form, the lost-motion device 18 is incorporated with a detent disk 19 having detents 20 on the rim thereof which selectively engage a resilient detent arm 21 when the disk is rotated, in order to properly and selectively position the turret in its various "coarse-tuned" operating positions. Lost motion is provided by a tongue 22 attached to a tongue plate 23 which in turn is attached to the shaft 16. The tongue 22 projects into an angular slot 24 in the detent disk 19, which disk is rotatable upon the shaft 16.

Thus it will be seen that a limited amount of rotary lost motion is provided between the knob 17 and the detent disk 19, thereby providing a limited angular rotary movement of the turret in each detented tuning position. This amount of limited rotary motion may be increased in certain of the positions by elongating the detents 20, as is disclosed and claimed in Patent No. 2,612,051 issued to David C. Felt and assigned to the same assignee as in the present patent application.

Figure 2:
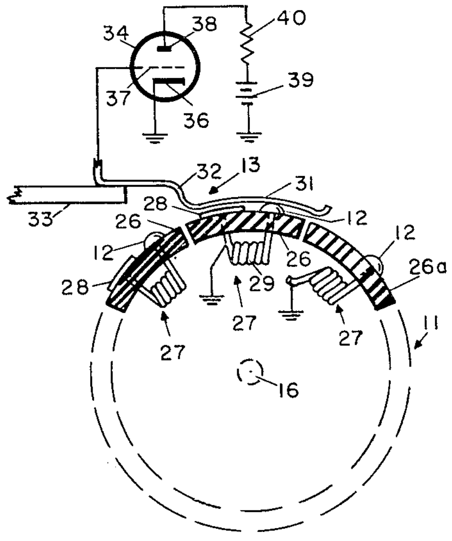
Figure 2 is a cross-sectional view of an embodiment of Figure 1 taken on the line 2—2 thereof, showing a modification in the contact arms and schematically a portion of an electrical circuit.
Figure 3:
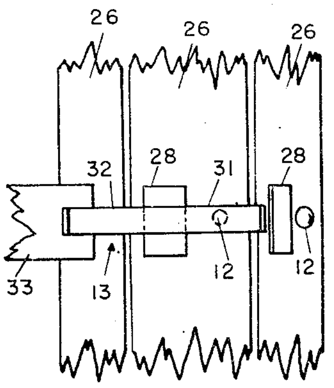
Figure 3 is a top plan view of a portion of Figure 2.

Referring now particularly to Figures 2 and 3, the turret 11 comprises a plurality of insulative strips 26 extending along the length thereof. At least one tuning circuit 27 is attached to each strip 26 and preferably terminates in a contact 12 which preferably projects outwardly from the surface of the corresponding tuning strip 26. In the preferred embodiment, a capacitor plate 28 is attached to some or all of the tuning sections 26, as shown. The capacitor plate 28 is shown connected to one end of an inductance coil 29, the other end thereof being connected to the contact pin 12. The capacitor plate 28 is preferably grounded, as shown. The inductance 29 and capacitor 28 form the tuned circuit 27.

It will be readily seen by those skilled in the art that when my device is used in the frequency ranges associated with television and radio receivers, contact arm 13 represents an inductance. Further, contact arm 13 comprises a curved portion 31 which is curved about the axis of the tuning shaft 16, and which is positioned so as to selectively engage the contact pins 12 when the turret 11 is rotated into its several detent positions. The length of the curved portion 31 is preferably approximately equal to the width of the tuning strip 26. The contact arm 31 also comprises a resilient portion 32 and is attached to a support member 33 at an end thereof remote from the curved portion 31. A preferred electrical circuit is shown comprising an electronic tube 34, or a transistor or the like containing a cathode 36 which is grounded, a control electrode 37 which is electrically connected to the contact arm 13, and an anode 38 which is connected to a source 39 of voltage through a load impedance 40.

The novel tuner operates as follows:

Each tuning section 26 and its tuned circuits 27 are factory adjusted so as to be in approximate correct tuning when the contact pin 12 is centered on the curved portion 31 of the contact arm 13. The lost-motion mechanism 18 permits the contact 12 to be moved along the curved portion 31 of the contact arm 13 a limited extent in each of the turret tuning positions, thereby changing the inductance of the circuit by means of changing the effective electrical length of the contact arm 13, and also at the same time changing the capacitance of the tuned circuit 27 by changing the effective spacing between or overlapping areas of the capacitance plate 28 and the contact arm 13.

It will be noted that in the preferred arrangement shown, the inductance and capacitance of the tuned circuit 27 are changed in the same sense or direction; i. e., when the inductance of the circuit is increased, the capacitance thereof is also increased, and vice versa. The parts are thus positioned to obtain and maintain a constant L–C ratio or electrical "Q" of the tuned circuit 27 throughout the fine tuning range. If only the inductance is desired to be changed, for the fine tuning, the capacitor plate 28 may be omitted as shown in connection with the tuning strip 26*a* (Fig. 2), whereby only the inductance of the circuit will be changed during the fine tuning procedure.

It will be appreciated that the invention accomplishes both coarse tuning and fine tuning with a single tuning knob, and furthermore that the novel electrical arrangement is capable of providing increased electrical efficiency of the circuit over the fine tuning ranges, by maintaining a constant L–C ratio of the electrical circuit.

While preferred embodiments of the invention have been shown and described, various modifications thereof will be apparent to those skilled in the art. The true scope of the invention is defined in the following claims.

What is claimed is:

1. An electrical tuning device comprising an element of a tuned circuit, a contact member connected to said element, an inductive elongated contact arm, an electrical circuit connected to a single point on said arm, means to selectively connect said contact member to said contact arm, means to slide said contact member along said arm to continuously vary the inductance between said element and said electrical circuit and a capacitor plate connected to said tuned circuit, said capacitor plate positioned to move with respect to said contact arm when said contact is slid along said arm, whereby both the capacitance and inductance of said tuned circuit are varied.

2. An electrical tuning device comprising a rotatable turret structure, a contact pin extending from the surface of said turret, an element of a tuned circuit contained in said turret and electrically connected to said contact pin, an inductive elongated contact arm positioned adjacent the surface of said turret and extending along and near a portion of the circumference thereof, an electrical circuit connected to a single point on said contact arm, said contact pin selectively engaging said contact arm and sliding therealong when said turret is rotated to continuously vary the inductance between said element and said electrical circuit and a capacitor plate electrically connected to said tuning element, said capacitor plate positioned on said turret to form a continuously variable capacitance in cooperation with said contact arm when said turret is rotated.

3. A device in accordance with claim 2, in which said contact arm contains a curved contact area, said curve being centered on the axis of rotation of said turret.

4. The device in accordance with claim 1, in which said capacitor plate is positioned with respect to said contact arm so that said variations of inductance and capacitance occur simultaneously and in the same sense.

5. The device in accordance with claim 1, in which said capacitor plate is positioned near said contact arm substantially between said contact member and the point of connection of said electrical circuit to said arm.

6. The device in accordance with claim 2, in which said tuned circuit comprises inductance which varies when said contact pin slides along said contact arm, the variation of said inductance occurring in the same sense as said variation of capacitance.

References Cited in the file of this patent

UNITED STATES PATENTS

| | | |
|---|---|---|
| 2,062,379 | Silver | Dec. 1, 1936 |
| 2,141,613 | Melicharek | Dec. 27, 1938 |
| 2,244,023 | Sauer | June 3, 1941 |
| 2,385,131 | Garthwaite | Sept. 18, 1945 |
| 2,496,183 | Thias et al. | Jan. 31, 1950 |
| 2,513,392 | Aust | July 4, 1950 |
| 2,558,454 | Niemaher et al. | June 26, 1951 |
| 2,643,361 | Mackey | June 23, 1953 |